(12) United States Patent
Hsieh et al.

(10) Patent No.: US 6,919,642 B2
(45) Date of Patent: Jul. 19, 2005

(54) METHOD FOR BONDING IC CHIPS TO SUBSTRATES INCORPORATING DUMMY BUMPS AND NON-CONDUCTIVE ADHESIVE AND STRUCTURES FORMED

(75) Inventors: Yu-Te Hsieh, Taoyuan (TW); Shyh-Ming Chang, Hsinchu (TW); Wen-Ti Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/190,276

(22) Filed: Jul. 5, 2002

(65) Prior Publication Data

US 2004/0004292 A1 Jan. 8, 2004

(51) Int. Cl.[7] .................. H01L 23/48; H01L 23/52; H01L 29/40
(52) U.S. Cl. ..................................... 257/778
(58) Field of Search ................. 257/778, 779, 257/782, 786, 737, 747, 738; 438/108, 613

(56) References Cited

U.S. PATENT DOCUMENTS

| 5,523,628 A | * | 6/1996 | Williams et al. | 257/777 |
| 5,734,199 A | * | 3/1998 | Kawakita et al. | 257/737 |
| 6,462,420 B2 | * | 10/2002 | Hikita et al. | 257/777 |
| 6,724,084 B1 | * | 4/2004 | Hikita et al. | 257/737 |

* cited by examiner

Primary Examiner—David A. Zarneke
(74) Attorney, Agent, or Firm—Akin Gump Strauss Hauer & Feld, LLP

(57) ABSTRACT

An IC chip/substrate assembly bonded together by a non-conductive adhesive and a method for forming the assembly. The assembly consists of an IC chip that has bumps formed on an active surface, a substrate that has bond pads formed on a top surface, wherein at least one of the IC chip and the substrate has dummy bumps formed in-between the bumps or the bond pads, and a non-conductive adhesive disposed in between and bonding the IC chip and the substrate together in a face-to-face relationship with the bumps in electrical communication with the bond pads.

13 Claims, 5 Drawing Sheets

METHOD FOR BONDING IC CHIPS TO SUBSTRATES INCORPORATING DUMMY BUMPS AND NON-CONDUCTIVE ADHESIVE AND STRUCTURES FORMED

FIELD OF THE INVENTION

The present invention generally relates to a method for forming IC chip/substrate assemblies incorporating dummy bumps and an adhesive and assemblies formed, more particularly, relates to a method for bonding an IC chip to a substrate by a non-conductive adhesive wherein at least one of the IC chip and substrate is formed with dummy bumps on a surface to be bonded and assemblies formed by the method.

BACKGROUND OF THE INVENTION

In the fabrication of modern semiconductor devices, the ever increasing device density and decreasing device dimensions demand more stringent requirements in the packaging or interconnecting techniques of the devices. In recent years, a flip-chip attachment method or flip-chip direct chip attachment (DCA) method has been used in packaging integrated circuit chips. In the flip-chip attachment method, instead of attaching an integrated circuit lead frame in a package, an array of solder balls is formed on the surface of the die for the subsequent bonding to a printed circuit board or an interposer. The formation of the solder balls can be carried out by an evaporation method utilizing a solder material consisting mainly of tin and lead through a mask to produce the balls in a desired pattern. More recently, the techniques of electrodeposition or printing have been used to mass produce solder balls in a flip-chip packaging process.

In the direct chip attachment method, all the interconnections between a semiconductor chip and a printed circuit board (PCB) or a flexible substrate can be formed simultaneously and therefore maximizing fabrication throughputs. For instance, in direct attachment, solder bumps or solder balls are used to connect a chip directly to a printed circuit board or a flexible substrate. In a regular printed circuit board, the density of the interconnections is not formed high enough to match that normally found on a chip surface. In other words, the pitch between the bond pads formed on a chip is smaller than the pitch formed between interconnections on a printed circuit board. An interposer is therefore used to provide a transition and to accommodate the bond pads/interconnections which are spaced differently. An interposer board is frequently fabricated of the same material as that used in the printed circuit board, i.e., an epoxy-type polymeric material. When a high density interconnect printed circuit board is utilized in a flip-chip method for bonding to a semiconductor chip, the use of the interposer may not be necessary.

The use of organic substrates, or polymeric-base substrates, in printed circuit boards, flexible substrates or interposers introduces a new source of problem for the flip-chip bonding of a silicon chip which is mostly inorganic to such substrates. The problem is the mismatch of coefficients of thermal expansion (CTE) between the printed circuit board and the silicon chip. The coefficient of thermal expansion for the printed circuit board material is at least five times that of the silicon material. The extreme mismatch in CTE's between the silicon chip and the organic substrate of the printed circuit board therefore subjects solder joints formed therein between to extremely large thermal strains, which leads to premature failure of the solder connections.

One method proposed for alleviating such thermal strains is the introduction of an encapsulating layer between the silicon chip and the organic substrate. The encapsulating material, known as an underfill, which is typically a silica filled epoxy is used to fill the gap (or standoff) between the printed circuit board and the silicon chip. Since the silicon chip is normally covered, in a final fabrication step, by a polymer passivation/stress buffer layer such as a polyimide film, the underfill forms a bond between the polyimide layer on the chip and the organic substrate of the printed circuit board encapsulating the solder joints.

Referring initially to FIG. 1, wherein a flip-chip 10 bonded by a plurality of solder balls 12 and an underfill layer 14 is shown. The encapsulating material, or the underfill layer 14, is typically a silica filled epoxy for filling the gap, or the standoff, between the printed circuit board 16 and the silicon chip 18. As shown in FIG. 1, the underfill layer 14 forms a bond between a polyimide layer 20, which is a passivation/stress buffer layer that covers the silicon chip 18, and the printed circuit board 16 encapsulating the solder balls 12.

While the introduction of the underfill layer between a silicon chip and an organic substrate for the printed circuit board has enhanced the thermal cycling resistance of a flip chip assembly, the dispensing of the underfill material in between a silicon chip and a substrate and filling the gap is a time consuming task. In one conventional method, as shown in FIGS. 2A–2C, an underfill dispenser 22 is first used to dispense an underfill material 24 onto the top surface 26 of a substrate 28. A layer 30 of the underfill material 24 is thus formed on the top surface 26. A chip holder 32, usually a vacuum holder, is then used to position an IC chip 34 which is pre-deposited with a plurality of solder balls 36 on a top surface 38 over the substrate 28. The IC chip, or die 34 is then pressed onto the substrate 28 with the plurality of solder balls 36 connecting to corresponding electrical conductors (not shown) on the surface 26 of the substrate 28. The assembly 40 for the flip chip is then placed in a reflow oven and heated to a temperature not less than the reflow temperature for the solder material utilized in the plurality of solder balls 36. The reflow process further cures the underfill material 30 and improves its mechanical strength.

Several drawbacks are inherent in this technique. For instance, there is possibly an underfill material layer between the plurality of the solder balls on the IC chip and the plurality of electrical conductors on the substrate. Since the underfill material is an insulating material, this affects the contact resistance formed between the joints. Secondly, in the process of pressing the IC die 34 onto the underfill material layer 30, air entrapment in the underfill material 30 is inevitable. Trapped air bubbles in the underfill material layer 30, or in the epoxy material layer 30, affect the mechanical strength enhancement by the underfill material and furthermore, affect the adhesion formed between the underfill material and the IC die or the substrate.

In another conventional technique for dispensing underfill materials, shown in FIGS. 3A–3F, an underfill material is fed into the standoff between an IC die and a substrate by the capillary effect on the underfill liquid. As shown in FIG. 3A, a wafer 42 is first sectioned into individual dies 44 by a diamond saw 46. The IC dies 44 are provided with a plurality of solder balls 48 on a top surface 50 of the dies. After all the dies 44 are severed from wafer 42, they are placed in a holder tray 52, as shown in FIG. 3B. In the next step of the process, a vacuum head 54 is used to remove an IC die 44 from the tray 52 and to position the die over a substrate 56. It is noted that a plurality of electrical conductors 58, corresponding to the number and positions of the solder balls 48 are provided on a top surface 60 of the substrate 56. It should be noted that the substrate 56 may be either a printed circuit board or an interposer. After the IC die 44 is mounted to substrate 56 by intimately contacting the solder balls 48 with the electrical conductors 58, as shown in FIG. 3D, a solder reflow process is carried out to reflow the solder and to form a permanent bond between the IC die 44 and the substrate 56. It should be noted that the plurality of electrical conductors 58 are not shown in FIG. 3D for simplicity reasons.

The flip chip package 62 is then ready for the underfill process in which an underfill dispenser 64, such as a liquid syringe, is used to dispense an underfill material 66 at an edge of the flip chip package 62. Since a gap 68, or the standoff, between the chip 44 and the substrate 56 is relatively small, i.e., in the neighborhood between about 50 $\mu$m and about 100 $\mu$m, a capillary effect causes the underfill material 66 to flow into the gap 68 and fill up the gap. Since the underfill dispensing process utilizes capillary effect, several factors may influence the underfill filling process. For instance, the viscosity of the underfill materials 56 and the temperature of the substrate 56 and the IC die 44. Moreover, the capillary flow process for the underfill material 56 is time consuming, i.e., up to 1 minute flow time required to fill under an IC die which has a dimension of 10 mm×10 mm. A completed flip chip 62 with the underfill dispensed between the IC die 44 and the substrate 56 is shown in FIG. 3F.

In still another conventional technique in bonding an IC chip to a substrate, non-conducting adhesives have been used to achieve the bonding. This is shown in FIGS. 4A and 4B. An assembly 70 is formed by an IC chip 72 and a substrate 74 bonded together by a non-conductive adhesive 76. Electrical communication between the IC chips 72 and the substrate 74 is established between bond pads 78 on the IC chip 72 and the bond pads 80 on the substrate 74 with gold bumps 82. A serious thermal mismatch occurs between the non-conductive adhesive 76, the silicon chip 72, and the polymeric-based substrate 74. After the bonding process by the non-conductive adhesive 76, the assembly 70 may bow or warp due to built-in thermal stresses. This is shown in FIG. 4B. An IC chip/substrate assembly 70 bonded together with a non-conductive adhesive 76 without containing any fillers in the adhesive cannot pass a thermal stress test or any other thermal reliability test. A failed sample of the IC chip/substrate assembly after a thermal stress test, i.e., was cycled between –55° C. and 125° C., is shown in FIG. 5 in an electronic scanning micrograph.

In a copending application assigned to the common assignee of the present invention, attorney Docket No. 64600-085, a method for bonding an IC chip to a substrate by a non-conductive adhesive containing between about 5% and 25% of a non-conductive filler and an IC chip/substrate assembly bonded together by the method are disclosed. As shown in FIGS. 6A–6D, in the first step of the process, a substrate 90 that has bond pads 84 formed on a top surface 86 is provided. A non-conductive adhesive 88 is then deposited on a top surface 86 to cover the bond pads 84. The non-conductive adhesive contains a non-conductive filler such as silica sand having particle sizes between about 0.2 $\mu$m and about 20 $\mu$m. An IC chip 94 that has a plurality of bumps 96 formed on an active surface 98 is then positioned on top of the substrate 90. The plurality of bumps may be suitably formed of a metallic material that has a significantly lower hardness when compared to the hardness of the non-conductive filler particles, such that the filler particles are pressed into the top surface of the bumps 96 and not to impede electrical communication between the bumps 96 and the bond pads 84.

In the next step of the process, as shown in FIG. 6C, an inner-lead bonder 110 is used to bond the IC chip 94 and the substrate 90 together under suitable heat and pressure forming an IC chip/substrate assembly 100. FIG. 6D shows the assembly 100 after the bonding process is completed in the inner-lead bonder 110.

The process described in the co-pending application, while reduces the mismatch in the coefficients of thermal expansion between the IC chip and the substrate to certain extent, does not provide sufficient reduction in such mismatch in many circumstances. In other words, the deformation shown in FIG. 4B is still observed when such non-conductive fillers are used in the underfill, i.e., the non-conductive adhesive material.

It is therefore an object of the present invention to provide a method for bonding an IC chip to a substrate by a non-conductive adhesive without the drawbacks or shortcomings of the conventional bonding methods.

It is another object of the present invention to provide a method for bonding an IC chip to a substrate by a non-conductive adhesive wherein only a minimal amount of the non-conductive adhesive is required, thus minimizing the thermal mismatch.

It is a further object of the present invention to provide a method for bonding an IC chip to a substrate by a non-conductive adhesive by forming dummy bumps on at least one of the bonding surfaces of the IC chip and the substrate.

It is another further object of the present invention to provide a method for bonding an IC chip to a substrate by a non-conductive adhesive by forming dummy bumps on both bonding surfaces of the IC chip and the substrate.

It is still another object of the present invention to provide an IC chip/substrate assembly bonded together by a non-conductive adhesive wherein dummy bumps are formed on the bonding surface of at least one of the IC chip and the substrate.

It is still another further object of the present invention to provide an IC chip/substrate assembly bonded together by a non-conductive adhesive in which dummy bumps are formed on the bonding surfaces of both the IC chip and the substrate.

SUMMARY OF THE INVENTION

In accordance with the present invention, a method for bonding an IC chip to a substrate by a non-conductive adhesive and an IC chip/substrate assembly bonded together by the method are disclosed.

In a preferred embodiment, an IC chip/substrate assembly is provided which includes an IC chip that has bumps formed on an active surface; a substrate that has bond pads formed on a top surface; at least one of the IC chip and the substrate has dummy bumps formed in between the bumps or the bond pads; and a non-conductive adhesive disposed in-between and bonding the IC chip and the substrate together in a face-to-face relationship with the bumps in electrical communication with the bond pads.

In the IC chip/substrate assembly, the dummy bumps may be formed in a single block, or may be formed in a plurality of elongated strips. The dummy bumps may be formed on the active surface of the IC chip in-between the bumps, or may be formed on the top surface of the substrate in-between the bond pads. The dummy bumps may also be formed on both the active surface of the IC chip between the bumps and on the top surface of the substrate in-between the bond pads. The IC chip may be a driver chip for a LCD display panel. The substrate may be formed of a material selected from the group consisting of polymeric material, ceramic, metal and glass. The dummy bumps may be formed of a material that has a coefficient of thermal expansion in-between those for the IC chip and the substrate.

In the IC chip/substrate assembly, the non-conductive adhesive may be a thermoset polymeric adhesive, or an epoxy-type adhesive. The dummy bumps may be formed of copper or aluminum. The dummy bumps may be formed in-between the bumps or the bond pads occupying between about 1% and about 100% of an area in-between the bumps or the bond pads, or preferably between about 30% and about 70% of an area in between the bumps or the bond pads.

The present invention is further directed to a method for bonding an IC chip to a substrate by a non-conductive adhesive which can be carried out by the operating steps of first providing an IC chip that has bumps formed on an active surface; then providing a substrate that has bond pads formed on a top surface; then forming dummy bumps on at least one of the IC chip and the substrate in-between the bumps or the bond pads; depositing a non-conductive adhesive in between the top surface of the substrate and the active surface of the IC chip; aligning the bumps to the bond pads by positioning the active surface of the IC chip juxtaposed to the top surface of the substrate; and pressing the IC chip and the substrate together under heat and pressure until the bumps are electrically connected to the bond pads.

The method for bonding an IC chip to a substrate by a non-conductive adhesive may further include the step of forming the dummy bumps in a single block, or the step of forming the dummy bumps in a plurality of elongated strips. The method may further include the step of forming the dummy bumps on the active surface of the IC chip in-between the bumps, or the step of forming the dummy bumps on the top surface of the substrate in-between the bond pads, or the step of forming the dummy bumps on the top surface of the substrate in between the bond pads and on the active surface of the IC chip in between the bumps. The bumps may be formed of a metal selected from the group consisting of Au, Ni and Sn-containing metal alloys. The substrate may be formed of a polymeric material, while the non-conductive adhesive may be formed of a thermoset polymeric-based adhesive. The method may further include the step of pressing the IC chip and the substrate together in an inner lead bonder tool.

BRIEF DESCRIPTION OF THE DRAWINGS

These and other object, features and advantages of the present invention will become apparent from the following detailed description and the appended drawings in which:

FIG. 2C is a schematic illustrating the conventional method for dispensing underfill shown in FIG. 2A after the IC die is bonded to the substrate with the underfill material therein between.

These and other objects, features and advantages of the present invention will become apparent from the following detailed description and the appended drawings in which:

DETAILED DESCRIPTION OF THE PREFERRED AND ALTERNATE EMBODIMENTS

The present invention discloses an IC chip/substrate assembly bonded together by a non-conductive adhesive and a method for forming the IC chip/substrate assembly.

The IC chip/substrate assembly is formed by an IC chip, a substrate and a non-conductive adhesive disposed therein between. The IC chip has bumps formed on an active surface, wherein the bumps may be formed of Au, Ni, or Sn-containing (solder-type) alloys.

The substrate has a plurality of bond pads formed on a top surface. The plurality of bond pads may be formed of copper, aluminum or any other suitable metal.

While the present invention method for bonding an IC chip to a substrate can be used in any semiconductor assembly applications, it is particularly suitable for bonding an IC chip which is a driver chip for a LCD display panel to a flexible substrate.

Figure 1:
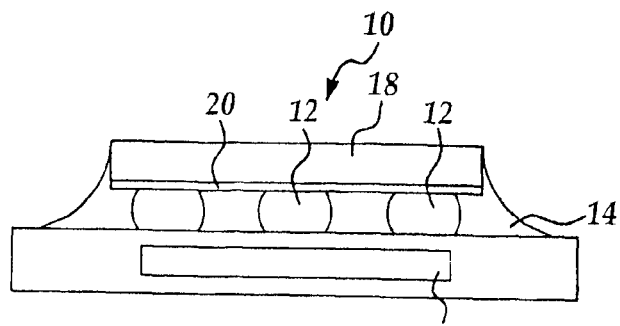
FIG. 1 is a schematic showing an enlarged, cross-sectional view of a conventional flip chip package including an IC die and a substrate bonded by a plurality of solder balls and an underfill material.
Figure 2A:
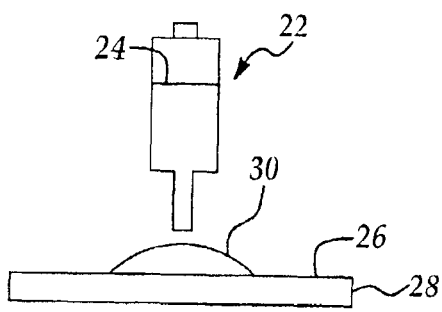
FIG. 2A is a schematic illustrating a conventional method for dispensing an underfill material on the top surface of a substrate.
Figure 2B:
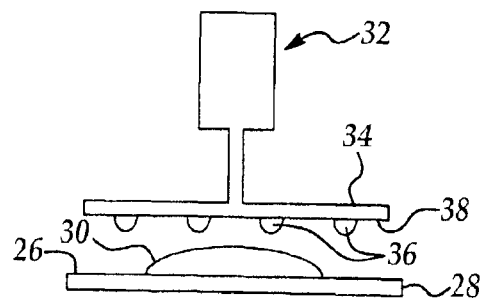
FIG. 2B is a schematic showing the conventional method of FIG. 2A with an IC chip positioned on top of a substrate.
Figure 2C:
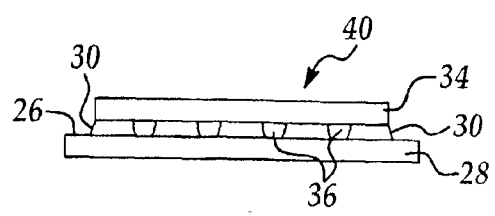
Figure 3A:
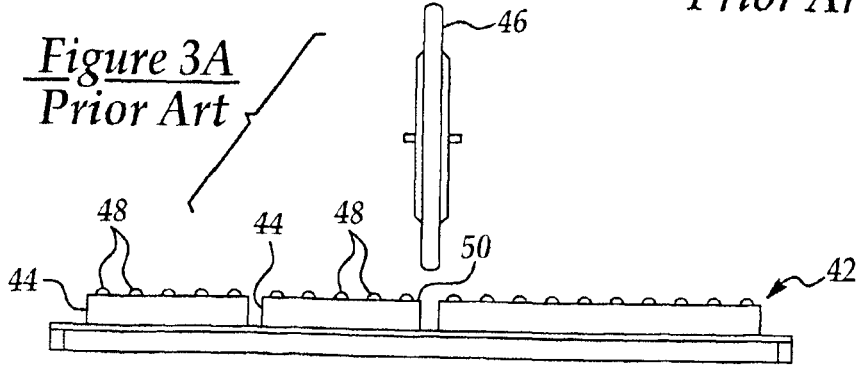
FIG. 3A is a schematic of another conventional method in which a diamond saw is first used to sever IC dies from a wafer.
Figure 3B:
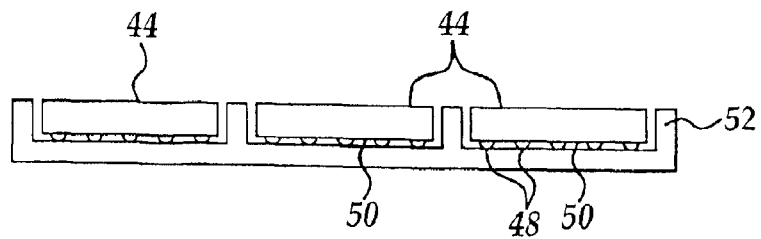
FIG. 3B is a schematic illustrating the severed IC dies positioned in a storage tray.
Figure 3C:
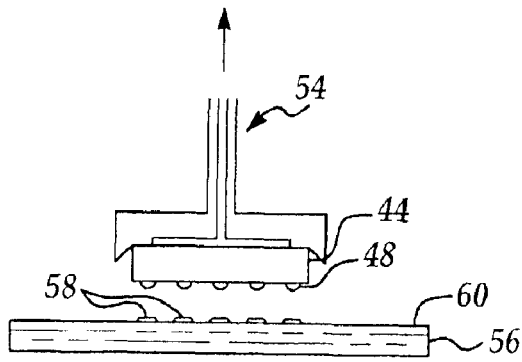
FIG. 3C is a schematic illustrating an IC die positioned over a corresponding substrate by a vacuum die holding device.
Figure 3D:
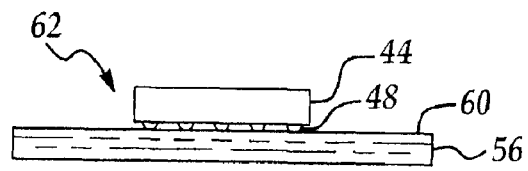
FIG. 3D is a schematic illustrating an IC die bonded to a substrate.
Figure 3E:
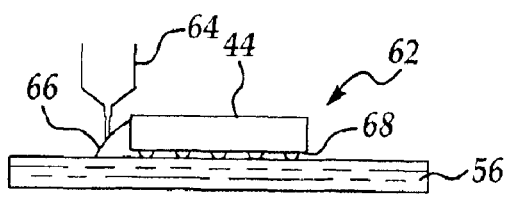
FIG. 3E is a schematic illustrating the flip chip package of FIG. 3D with the gap between the die and the substrate filled by capillary effect of an underfill material.
Figure 3F:
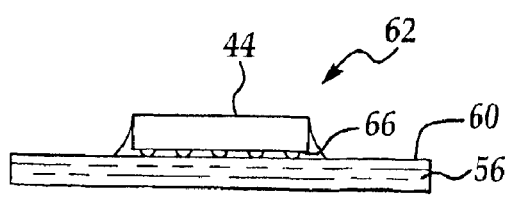
FIG. 3F is a schematic showing a flip chip package of FIG. 3E after the gap between the die and the substrate is filled with the underfill material.
Figure 4A:
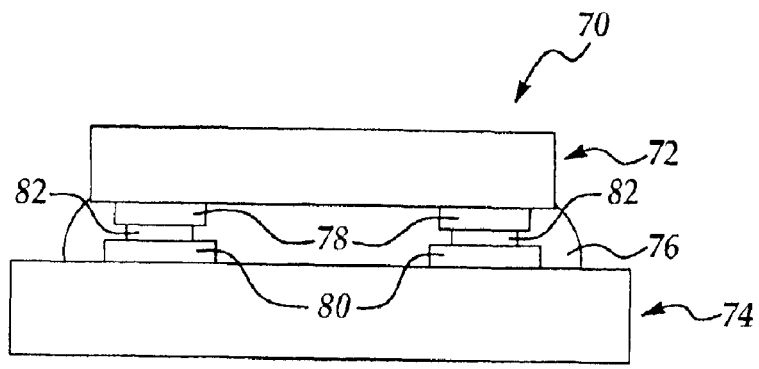
FIG. 4A is an enlarged, cross-sectional view of a third conventional IC chip/substrate assembly assembled together by a non-conductive adhesive.
Figure 4B:
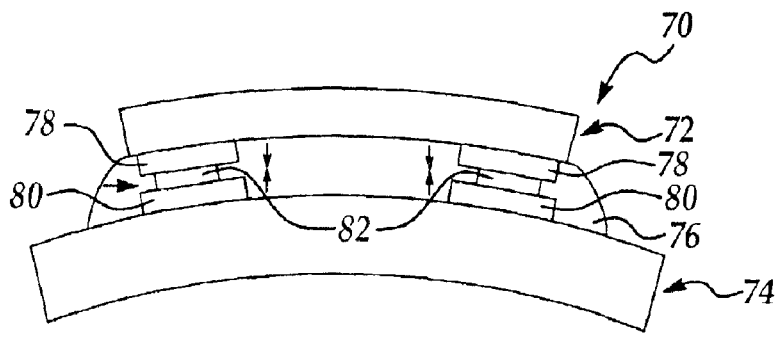
FIG. 4B is an enlarged, cross-sectional view of the IC chip/substrate assembly of FIG. 4A showing the effect of thermal mismatch between the adhesive, the substrate and the IC chip.
Figure 5:
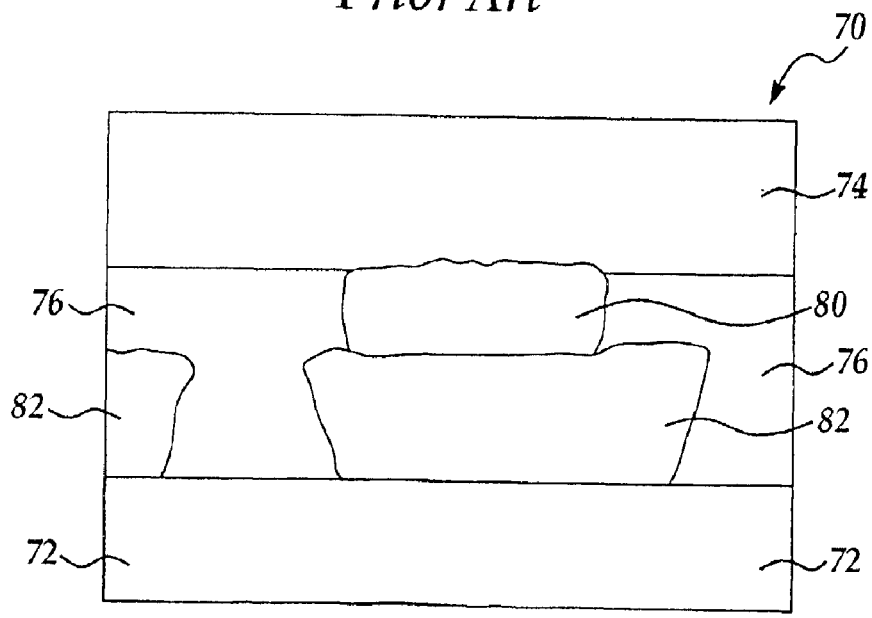
FIG. 5 is a graph illustrating an electron scanning micrograph of the IC chip/substrate assembly of FIG. 4B after failing a thermal stress test.
Figure 6A:
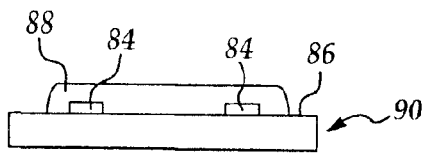
FIG. 6A is an enlarged, cross-sectional view of a substrate with a non-conductive adhesive deposited on a top surface.
Figure 6B:
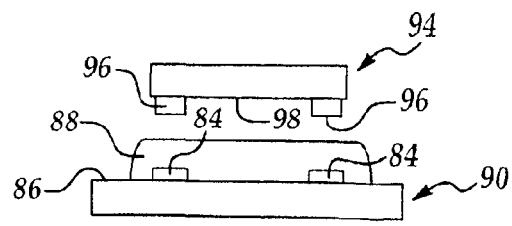
FIG. 6B is an enlarged, cross-sectional view of the substrate of FIG. 6A with an IC chip positioned on top.
Figure 6C:
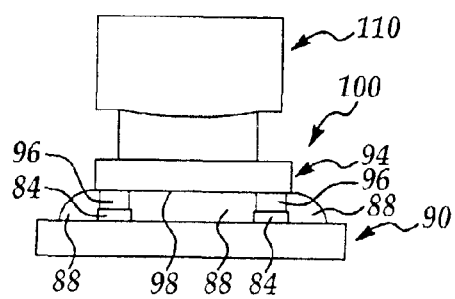
FIG. 6C is an enlarged, cross-sectional view of the substrate and IC chip pressed together in an inner-lead bonder.
Figure 6D:
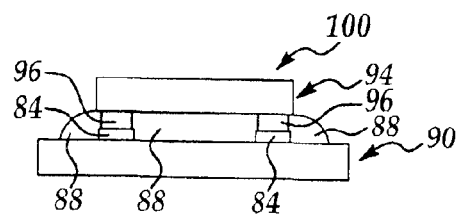
FIG. 6D is an enlarged, cross-sectional view of the IC chip/substrate assembly bonded together by the non-conductive adhesive.
Figure 7A:
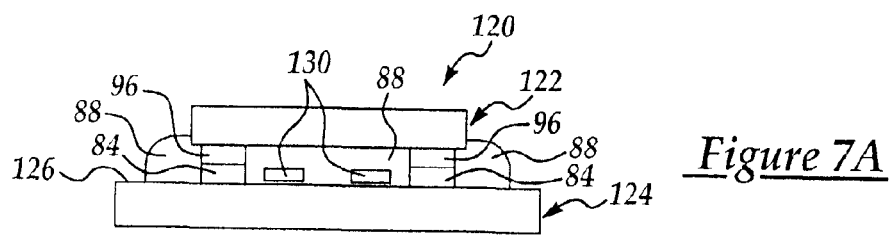
FIG. 7A is an enlarged, cross-sectional view of a present invention IC chip/substrate assembly in which dummy bumps are formed on the top surface of the substrate in-between the bond pads.
Figure 7B:
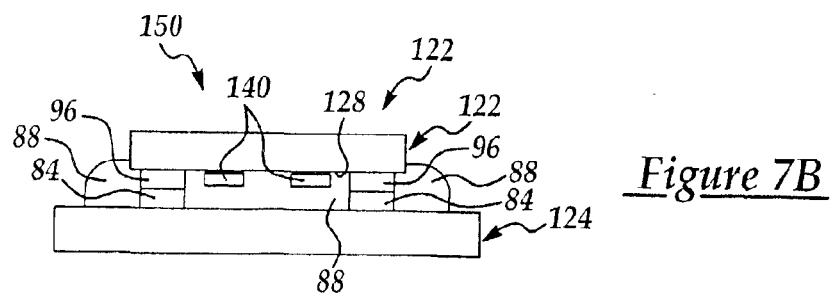
FIG. 7B is an enlarged, cross-sectional view of a present invention IC chip/substrate assembly in which dummy bumps are formed on the active surface of the IC chip in-between the bumps.

Referring now to FIG. 7A, wherein a present invention IC chip/substrate assembly 120 formed by an IC Chip 122 and a substrate 124 is shown. A non-conductive adhesive 88 is used to bond the IC chip 122 and the substrate 124 together. A plurality of bumps 96 are joined in electrical communication with a plurality of bond pads 84.

Also shown in FIG. 7A, a plurality of dummy bumps 130 are formed on the top surface 126 of the substrate 124. The dummy bumps 130 are formed in a plurality of elongated strips such as those shown in enlarged views of FIG. 8A, 8C or 8D. The function of the plurality of dummy bumps 130 is to occupy the space in-between the IC chip 122 and the substrate 124 when they are bonded together such that the use of the non-conductive adhesive 88 can be reduced or minimized.

In another preferred embodiment, the plurality of dummy bumps 140 is formed on an active surface 128 of the IC chip 122. An IC chip/substrate assembly 150 is thus formed.

Figure 7C:
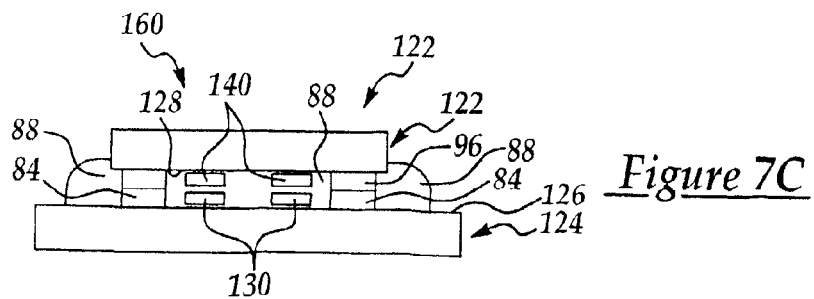
FIG. 7C is an enlarged, cross-sectional view of a present invention IC chip/substrate assembly wherein dummy bumps are formed both on the top surface of the substrate and on the active surface of the IC chip.

In still another preferred embodiment, shown in FIG. 7C, an IC chip/substrate assembly 160 is formed by an IC chip 122 equipped with a plurality of dummy bumps 140 on its active surface 128, and a substrate 124 equipped with a plurality of dummy bumps 130 formed on its top surface 126. It is noted that, in the preferred embodiment of IC chip/substrate assembly 160, the amount of the non-conductive adhesive 88 utilized in-between the IC chip 122 and the substrate 124 is minimized due to the presence of dummy bumps 130 and 140. It should also be noted that when both the active surface 128 of the IC chip 122 and the top surface 126 of the substrate 124 are formed with dummy bumps, the dummy bumps 130 and 140 should be kept at a distance and, thus, do not touch each other in order to avoid the imposition of stresses on either the IC chip or the substrate.

Figure 8A:
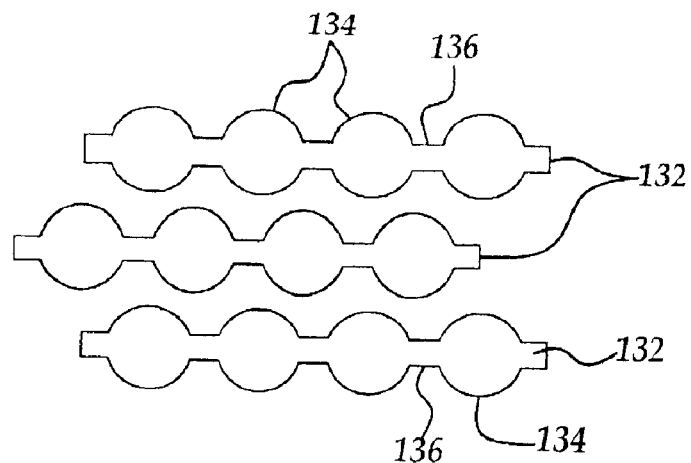
FIG. 8A is a plain view of a preferred embodiment of the present invention including dummy bumps.

The present invention dummy bumps 130, 140 may be formed in various number of configurations. A few examples are shown in FIGS. 8A~8D to illustrate the preferred embodiments. For instance, FIG. 8A shows the dummy bumps, formed of copper or aluminum, are arranged in a plurality of elongated strips 132. The elongated strip of dummy bumps 132 consists of dumbbell portions 134 and narrow connecting portions 136. The dumbbell portions 134 are utilized to occupy more volume in the space between the IC chip and the substrate.

Figure 8B:
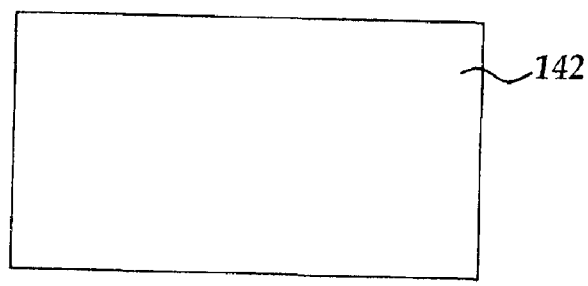
FIG. 8B is a plain view of another preferred embodiment of the present invention including dummy bumps formed in a single block.
Figure 8C:
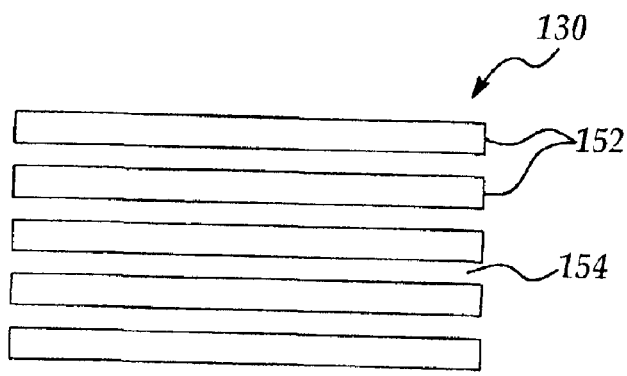
FIG. 8C is a plain view of still another preferred embodiment of the present invention including dummy bumps formed in a plurality of horizontal strips.
Figure 8D:
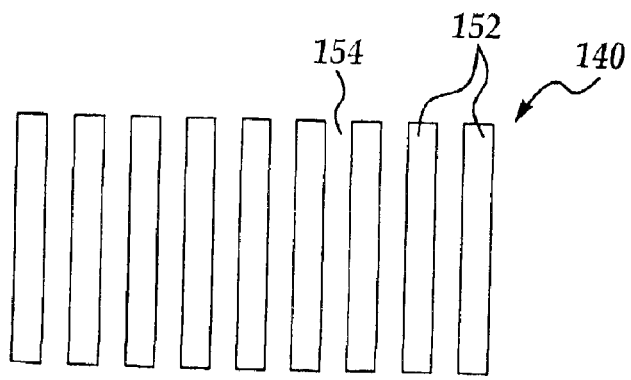
FIG. 8D is a plain view of yet another preferred embodiment of the present invention including dummy bumps formed in a plurality of vertical strips.

In another configuration, shown in FIG. 8B, a single block 142 of dummy bump is utilized to achieve maximum volume occupation. The single block of dummy bump 142 may be formed of copper or aluminum.

In another preferred embodiment, the plurality of elongated strips 152 of the dummy bumps are formed in either a horizontal direction or a vertical direction with space 154 therein between.

The present invention novel IC chip/substrate assembly bonded together by a non-conductive adhesive and a method for forming the assembly have therefore been amply described in the above description and in the appended drawings of FIGS. 7A~8D.

While the present invention has been described in an illustrative manner, it should be understood that the terminology used is intended to be in a nature of words of description rather than of limitation.

Furthermore, while the present invention has been described in terms of one preferred and two alternate embodiments, it is to be appreciated that those skilled in the art will readily apply these teachings to other possible variations of the inventions.

The embodiment of the invention in which an exclusive property or privilege is claimed are defined as follows.

What is claimed is:

1. An IC chip/substrate assembly comprising:
    an IC chip having connection bumps and at least one dummy bump formed over an active surface;
    a substrate having bond pads and at least one dummy bump formed over a top surface; and
    a non-conductive adhesive disposed in-between said IC chip and said substrate,
    wherein said at least one dummy bump of said IC chip is separated apart from said at least one dummy bump of said substrate when said connection bumps are electrically connected to said bond pads.

2. An IC chip/substrate assembly according to claim 1, wherein said at least one dummy bump is formed on said active surface of said IC chip in-between said connection bumps.

3. An IC chip/substrate assembly according to claim 1, wherein said at least one dummy bump is formed on said top surface of said substrate in-between said bond pads.

4. An IC chip/substrate assembly according to claim 1, wherein said IC chip is a driver chip for a LCD display panel.

5. An IC chip/substrate assembly according to claim 1, wherein said substrate is formed of a material selected from the group consisting of polymeric material, ceramic, metal and glass.

6. An IC chip/substrate assembly according to claim 1, wherein said at least one dummy bump is formed of a material having a coefficient of thermal expansion in-between those for said IC chip and said substrate.

7. An IC chip/substrate assembly according to claim 1, wherein said non-conductive adhesive is a thermoset polymeric material.

8. An IC chip/substrate assembly according to claim 1, wherein said non-conductive adhesive is an epoxy-type adhesive.

9. An IC chip/substrate assembly according to claim 1, wherein said at least one dummy bump is formed of Cu.

10. An IC chip/substrate assembly according to claim 1, wherein said at least one dummy bump formed in-between said connection bumps occupies between about 1% and about 100% of an area in-between said bumps.

11. An IC chip/substrate assembly according to claim 1, wherein said at least one dummy bumps formed in-between said bond pads occupies between about 1% and about 100% of an area in-between said bond pads.

12. An IC chip/substrate assembly according to claim 1, wherein each of said at least one dummy bump formed over said active surface of said IC has a height smaller than that of each of said connection bumps.

13. An IC chip/substrate assembly according to claim 1, wherein each of said at least one dummy bump formed over said top surface of said substrate has a height smaller than that of each of said bond pads.

* * * * *